United States Patent
Takahashi et al.

(10) Patent No.: US 6,206,969 B1
(45) Date of Patent: Mar. 27, 2001

(54) METHOD AND APPARATUS FOR FABRICATING SEMICONDUCTOR

(75) Inventors: Kosei Takahashi, Nara; Sadayoshi Matsui, Tenri, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 08/853,863

(22) Filed: May 9, 1997

(30) Foreign Application Priority Data

May 9, 1996 (JP) .................................................. 8-115108

(51) Int. Cl.[7] .................................................. C23C 16/00
(52) U.S. Cl. .............................. 118/715; 118/719; 118/50; 118/724
(58) Field of Search .................................. 118/715, 719, 118/50, 724

(56) References Cited

U.S. PATENT DOCUMENTS

| | | |
|---|---|---|
| 4,664,062 | 5/1987 | Kamohara et al. . |
| 5,580,822 * | 12/1996 | Hayakawa et al. .................. 437/187 |

FOREIGN PATENT DOCUMENTS

| | | |
|---|---|---|
| 0 510 656 A2 | 4/1992 | (EP) . |
| 61-223608 | 10/1986 | (JP) . |
| 61-225817 | 10/1986 | (JP) . |
| 61-030664 | 12/1986 | (JP) . |
| 63-224214 | 9/1988 | (JP) . |
| 03201426 | 3/1991 | (JP) . |

OTHER PUBLICATIONS

T. Hayakawa, et al., *Journal of Crystal Growth* 95, pp. 343–347, 1989.

K. Takahashi, et al., *Journal of Crystal Growth* 150, pp. 1333–1337, 1995.

* cited by examiner

*Primary Examiner*—Elizabeth M. Cole
(74) *Attorney, Agent, or Firm*—David G. Conlin; Lisa Swiszcz Hazzard; Dike, Bronstein, Roberts & Cushman, LLP

(57) ABSTRACT

A semiconductor fabrication apparatus for evaporating a material in a growth chamber by a molecular beam epitaxy technique to fabricate a semiconductor is provided. The apparatus includes: an ultra-high vacuum chamber including a liquid nitrogen cold trap therein, the ultra-high vacuum chamber being connected to the growth chamber via a valve; a first evacuation system including an ultra-high vacuum evacuation system, the first evacuation system being connected to the ultra-high vacuum chamber; and a second evacuation system including an evacuation system capable of conducting an evacuation operation even in a low vacuum condition, the second evacuation system being connected to the liquid nitrogen cold trap. The first evacuation system and the second evacuation system independently conduct the respective evacuation operations.

11 Claims, 7 Drawing Sheets

--×-- Turbo-molecular pump suitable to ultra-high vacuum
---⊖--- Ion pump
—□— Oil diffusion pump
—●— Wide range turbo-molecular pump
······■······ Rotary pump/Mechanical booster pump

METHOD AND APPARATUS FOR FABRICATING SEMICONDUCTOR

BACKGROUND OF THE INVENTION

1. Field of the Invention

The present invention relates to a semiconductor fabrication method for growing a compound semiconductor on a semiconductor substrate (i.e., on a growth substrate) by a molecular beam epitaxy technique, and a semiconductor fabrication apparatus to be used for performing such a semiconductor fabrication method. In particular, the present invention relates to a semiconductor fabrication method capable of effectively simplifying the fabrication steps, particularly when a material having a high vapor pressure is used, and a semiconductor fabrication apparatus to be used for performing such a semiconductor fabrication method.

2. Description of the Related Art

In order to grow a high-quality compound semiconductor crystal to be used for such devices as semiconductor light-emitting devices or high-speed electron devices, a molecular beam epitaxy (MBE) technique, a metal-organic chemical vapor deposition (MOCVD) technique, a liquid phase epitaxy (LPE) technique, or the like, are typically employed. Among them, the MBE technique has many advantages such as its high controllability of growth of an ultra-thin film, ability to grow a fine crystal at a relatively low temperature, ability to effectively use growth materials, and the availability of in-situ observation of a growth state.

It has been attempted to grow various types of semiconductor materials using the MBE technique, taking advantage of the favorable characteristics of the MBE technique as described above. In fact, the MBE technique can handle many kinds of semiconductor materials, including a material having an extremely high vapor pressure such as phosphorus, selenium, and sulfur. As a result, excellent results have been obtained in fabricating such devices as semiconductor lasers or the like.

In the case where a material having a high vapor pressure is grown by the MBE technique, it becomes important to maintain a favorable degree of vacuum in a growth chamber during the crystal growth process. An example of the conventional technique which has been intended to realize the above will described below, taking the case where a red-color light emitting semiconductor laser device (hereinafter, also simply referred to as the "red semiconductor laser") is grown as an example.

FIG. 7 shows a schematic configuration of one conventional example of an MBE apparatus, i.e., a semiconductor fabrication apparatus to be used for obtaining a red semiconductor laser using the MBE technique. The use of this type of the MBE apparatus for obtaining a practical red semiconductor laser is described, for example, in T. Hayakawa et al.: Journal of Crystal Growth, 95, (1989), pp.343–347 (hereinafter referred to as "Document 1"); and K. Takahashi et al.: Journal of Crystal Growth, 150, (1995), pp.1333–1337 (hereinafter referred to as "Document 2").

Document 1 refers, in its Conclusion section, to the fabrication of an AlGaInP type red semiconductor laser using solid materials through the MBE technique as one example. Document 1 further reports that the use of the MBE technique allows a thickness of a grown layer and various parameters of a doping process to be well-controlled, and further enables obtaining a uniform crystal. In particular, it is reported that a p-type cladding layer can be doped at a high concentration of $10^{18}$ cm$^{-3}$, resulting in continuous oscillation at a wavelength of 671 nm at a room temperature being obtained using a gain-guide type semiconductor laser.

Document 2 describes, in its Abstract, that the fabrication of an AlGaInP type red semiconductor laser using solid materials through the MBE technique has been successfully put into practical use. It is further pointed out therein that reduction of the amount of toxic impurities entering crystal and optimization of a growth temperature are important in order to improve the characteristics of a semiconductor laser device to be fabricated.

The conventional MBE apparatus illustrated in FIG. 7 has three ultra-high vacuum chambers. Specifically, they include two growth chambers 51 and 53, and an intermediate chamber 52 placed between the two growth chambers 51 and 53 so as to connect them to each other. A wafer introducing chamber is further provided so as to be connected with the intermediate chamber 52. A wafer (i.e., a substrate), on which semiconductor lasers are to be fabricated, is introduced into the MBE apparatus via the wafer introducing chamber, and then transferred inside the MBE apparatus from one chamber to the other.

In an actual fabrication process of red semiconductor lasers using the MBE apparatus as shown in FIG. 7, an introduced GaAs substrate is first placed in the growth chamber 51, and a GaAs buffer layer is grown on the GaAs substrate in the chamber 51. Then, the substrate is transferred to the growth chamber 53, and an AlGaInP light-emitting layer is grown in the chamber 53. Thereafter, the substrate is transferred back to the growth chamber 51, and a GaAs cap layer is grown in the chamber 51.

In the growth chamber 53, phosphorus having a high vapor pressure is utilized to grow the AlGaInP light-emitting layer. When a red semiconductor laser is fabricated using such a successive growth manner as described above, phosphorus is required to be effectively evacuated from the growth chamber 53 so as to maintain an ultra-high degree of vacuum in the growth chamber 53.

In order to achieve the above purpose, a turbo-molecular pump 50 (simply indicated as the "turbo pump" in the figure), which is capable of evacuating the growth chamber 53 to an ultra-high degree of vacuum, is utilized for evacuating the growth chamber 53 in addition to a rotary pump. An oil diffusion pump may be used instead of the turbo-molecular pump. In either case, it is important to evacuate phosphorus to the outside of the vacuum chamber 53 at an appropriate rate.

When the above kinds of the pumps are employed, the degree of a vacuum of about $10^{-10}$ mbar can be obtained by simultaneously employing a liquid nitrogen cryopanel (not shown in FIG. 7) disposed along the inner wall of the growth chamber 53.

Ion pumps are respectively employed for the chambers 51, 52 and 53 as well as the wafer introducing chamber in the MBE apparatus in FIG. 7. However, it should be noted that using only absorption pumps such as ion pumps, without employing other types of pumps, is not suitable for evacuating materials having a high vapor pressure such as phosphorus. This is because when the absorption pump is used for a long period of time, an evacuation capacity with respect to the materials (e.g., phosphorus) is saturated due to a high vapor pressure thereof.

During a crystal growth process in the configuration as shown in FIG. 7, a liquid nitrogen cryopanel within the growth chamber 53 and a liquid nitrogen cold trap 54 connected thereto are filled with liquid nitrogen so as to absorb phosphorus molecules, thereby maintaining a high degree of vacuum. However, when the growth process is successively carried out for a long period of time, the amount of adsorbed phosphorus becomes saturated. Thus, it is necessary to pause the growth at appropriate intervals so as to remove the phosphorus-absorbed liquid nitrogen from the liquid nitrogen cryopanel within the growth chamber 53 and the liquid nitrogen cold trap 54, thereby purging the absorbed phosphorus molecules.

FIG. 8 schematically shows a typical fabrication flow of semiconductor lasers in a conventional technique using the conventional MBE apparatus as described above.

In this fabrication flow, a wafer growth process, in which semiconductor laser devices are completed, requires about 3.6 hours. Typically, such a wafer growth process is repeated for 20 cycles, as indicated by 20 elliptic marks in the figure. The total time required for the 20 cycles of the wafer growth process is therefore about 72 hours (=3.6 hours×20), i.e., about 3 days.

After the 20 cycles of the wafer growth process are completed, the fabrication of new semiconductor lasers is ceased, and the step of purging the phosphorus adsorbed in the liquid nitrogen cryopanel is conducted for about 8 hours. Subsequently, the step of purging the phosphorus adsorbed in the liquid nitrogen cold trap 54 is conducted for about 20 hours.

As shown in FIG. 8, it takes about 1 day or longer to complete the step of purging the absorbed phosphorus after the crystal growth process of about three successive days. In other words, it is necessary to cease the fabrication of red semiconductor lasers for almost 1 day in order to complete the purging steps. This prevents improvement of a production efficiency of the red semiconductor lasers.

If the crystal growth process is successively performed over a longer period of time than described above, an evacuation efficiency of phosphorus from the chambers becomes saturated. In addition, it requires a longer period of time for the absorbed phosphorus to be purged. Therefore, a production efficiency is further lowered.

SUMMARY OF THE INVENTION

According to one aspect of the present invention, a semiconductor fabrication apparatus for evaporating a material in a growth chamber by a molecular beam epitaxy technique to fabricate a semiconductor is provided. The apparatus includes: an ultra-high vacuum chamber including a liquid nitrogen cold trap therein, the ultra-high vacuum chamber being connected to the growth chamber via a valve; a first evacuation system including an ultra-high vacuum evacuation system, the first evacuation system being connected to the ultra-high vacuum chamber; and a second evacuation system including an evacuation system capable of conducting an evacuation operation even in a low vacuum condition, the second evacuation system being connected to the liquid nitrogen cold trap. The first evacuation system and the second evacuation system independently conduct the respective evacuation operations.

The first evacuation system can include a turbo-molecular pump. The first evacuation system may include an oil diffusion pump.

The second evacuation system can include a wide-range turbo-molecular pump. The second evacuation system may include a rotary pump.

According to another aspect of the present invention, a semiconductor fabrication method for evaporating a material in a growth chamber by a molecular beam epitaxy technique to fabricate a semiconductor, using a semiconductor fabrication apparatus as described above, is provided. The method includes the steps of: stopping the evacuation operation of the second evacuation system, and evacuating the ultra-high vacuum chamber and the growth chamber using the first evacuation system, while conducting a growth process with respect to a wafer in the growth chamber; and stopping the evacuation operation of the first evacuation system and purging molecules absorbed onto the liquid nitrogen cold trap using the second evacuation system.

The step of purging the molecules absorbed onto the liquid nitrogen cold trap can include the step of introducing hot air into the liquid nitrogen cold trap so as to evaporate liquid nitrogen, thereby purging the absorbed molecules. Preferably, the hot air has a temperature in a range from about 40° C. to about 250° C., and more preferably, the hot air has a temperature of about 150° C.

The material can have a high vapor pressure. The material may be phosphorus.

Thus, the invention described herein makes possible the advantages of: (1) providing a semiconductor fabrication method capable of remarkably reducing time required for the step of purging materials having a high vapor pressure, such as phosphorus, thereby considerably improving a production efficiency of a semiconductor wafer; and (2) providing a semiconductor fabrication apparatus used for performing such a semiconductor fabrication method.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples, taking as an example the case where phosphorus, which is a material having a high vapor pressure, is employed.

The "material having a high vapor pressure" herein means a material which tends to deteriorate a degree of vacuum in a growth chamber during a pause in the growth process to such an extent that it is difficult to evacuate the growth chamber by an ultra-high vacuum pump such as an ion pump and a diffusion pump. Such materials includes, for example, phosphorus (P) and sulfur (S), both of which have a vapor pressure of about $10^{-3}$ torr or higher at an absolute temperature of about 400 K. Although selenium (Se) does not satisfy this condition, selenium deteriorates a degree of vacuum in the vacuum chamber to such an extent that it becomes difficult to evacuate the chamber using an ion pump during a pause in the growth process (specifically, a degree of vacuum deteriorates to $10^{-5}$ torr or higher). Therefore, selenium should be considered to be included with the materials having a high vapor pressure.

An absolute temperature of 400 K as mentioned above corresponds to the maximum temperature obtainable in a peripheral space around a water-cooled material cell (in which a material to be processed is contained) of the MBE apparatus during the pause in the growth process.

Furthermore, in the present specification, the boundary between an ultra-high vacuum condition (or the degree thereof) and a low vacuum condition (or the degree thereof) is defined at about $10^{-3}$ torr. More specifically, a degree of vacuum equal to or higher than about $10^{-3}$ torr is referred to as an ultra-high vacuum condition, while a degree or a vacuum lower than about $10^{-3}$ torr is referred to as a low vacuum condition.

Figure 1:
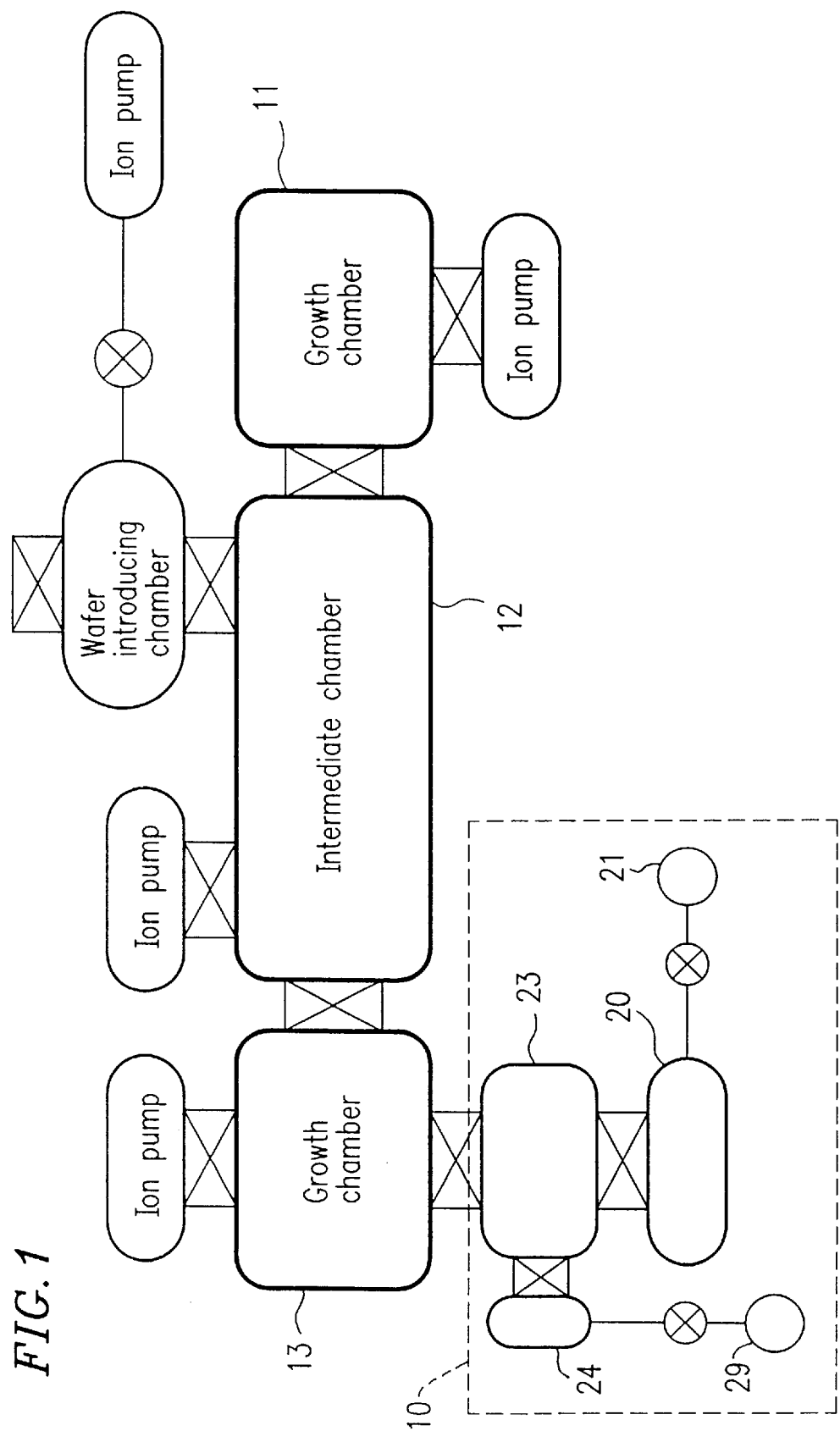
FIG. 1 is a schematic plan view showing a molecular beam epitaxy apparatus according to one embodiment of the present invention.

FIG. 1 shows an MBE apparatus, for growing an AlGaInP type red semiconductor laser, which serves as a semiconductor fabrication apparatus of the present invention.

This MBE apparatus has three ultra-high vacuum chambers, which includes two growth chambers 11 and 13, as well as an intermediate chamber 12 connecting the two growth chambers 11 and 13. A wafer introducing chamber is provided to be connected with the intermediate chamber 12. A wafer (i.e., a substrate), on which semiconductor lasers are to be fabricated, is introduced into the MBE apparatus via the wafer introducing chamber, and then transferred inside the MBE apparatus from one chamber to the other.

The MBE apparatus also includes ion pumps respectively provided for the chambers, as shown in FIG. 1. In addition, a liquid nitride cryopanel 27 (shown in FIG. 2) is disposed along the inner wall of the growth chamber 13.

Figure 2:
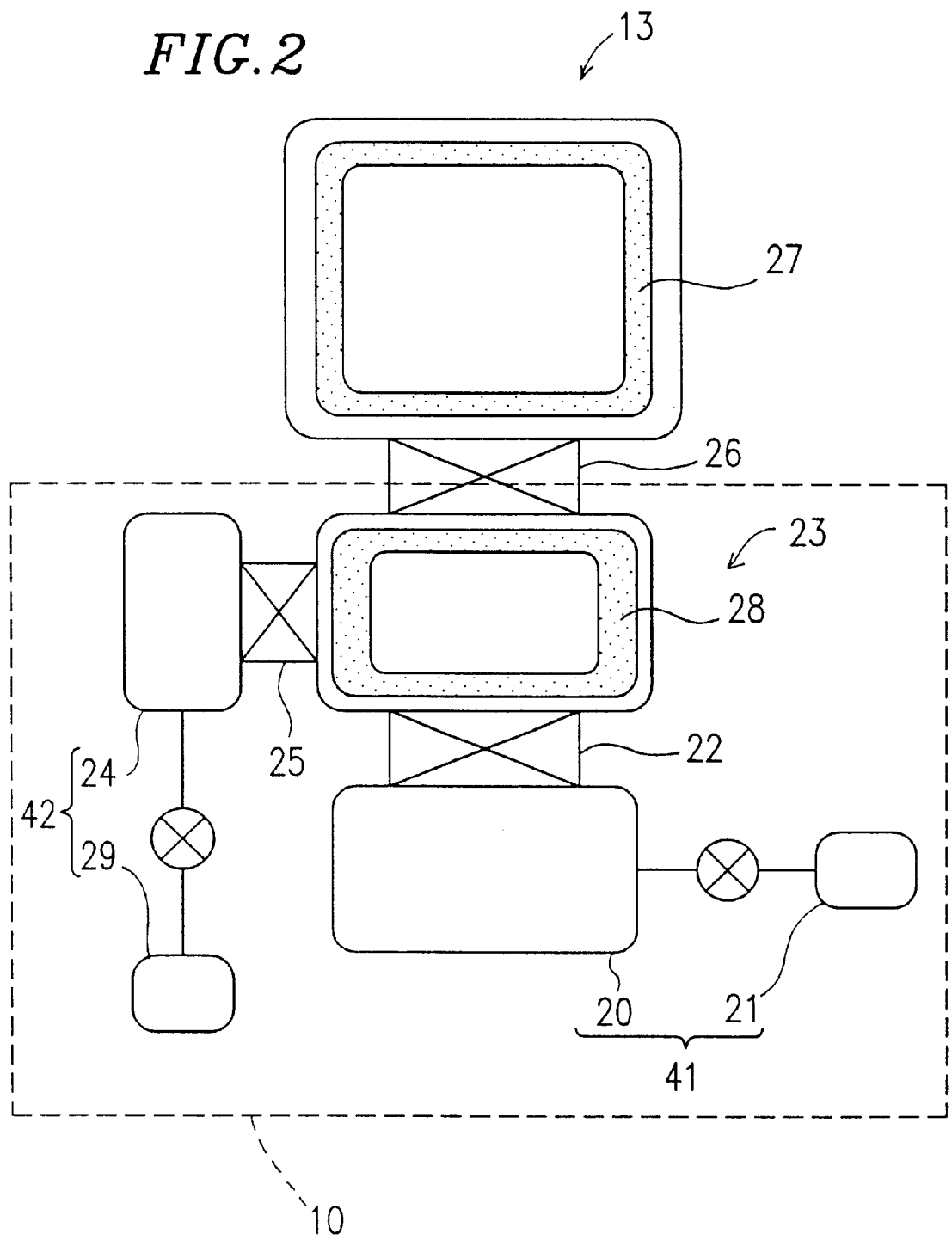
FIG. 2 is a schematic plan view showing the growth chamber and an evacuation system connected to the growth chamber of the molecular beam epitaxy apparatus shown in FIG. 1.

The growth chamber 13 is provided with an evacuation system 10 for phosphorus molecules, in order to grow an AlGaInP crystal on a GaAs substrate (i.e., on a growth substrate). FIG. 2 is an enlarged view specifically showing the evacuation system 10.

The evacuation system 10 includes an ultra-high vacuum chamber 23 connected to the growth chamber 13 via a gate valve 26. A liquid nitride cold trap 28 is disposed along the inner wall of the chamber 23. A turbo-molecular pump 20 is connected to the ultra-high vacuum chamber 23 via a gate valve 22 for evacuating the chamber 23 to an ultra-high vacuum condition, and a wide-range turbo-molecular pump 24 is connected to the liquid nitrogen cold trap 28 disposed in the chamber 23 via a gate valve 25. A rotary pump 21 is connected to the turbo-molecular pump 20, and another rotary pump 29 is connected the wide-range turbo-molecular pump 24.

Among the pumps, the turbo-molecular pump 20 and the rotary pump 21 can be collectively referred to as a first evacuation system 41. On the other hand, the wide-range turbo-molecular pump 24 and the rotary pump 29 can be collectively referred to as a second evacuation system 42. The first evacuation system 41 is suitable for obtaining an ultra-high vacuum condition, while the second evacuation system 42 is capable of conducting the evacuation operation even in a low vacuum condition.

With the above configuration, the turbo-molecular pump 20 and the wide-range turbo-molecular pump 24 can independently perform evacuation operations, respectively. In particular, the turbo-molecular pump 20 evacuates the ultra-high vacuum chamber 23 and the growth chamber 13 connected thereto. The wide-range turbo-molecular pump 24 evacuates the liquid nitrogen cold trap 28 connected thereto.

As described above, the liquid nitrogen cryopanel 27 is disposed within the growth chamber 13. Therefore, during the step of evacuating the ultra-high vacuum chamber 23 and the growth chamber 13 using the first evacuation system 41 (i.e., the turbo-molecular pump 20 and the rotary pump 21) while a growth process is conducted with respect to a wafer in the growth chamber 13, most of phosphorus molecules generated during the growth process are adsorbed by the liquid nitrogen cryopanel 27 and the liquid nitrogen cold trap 28. After the growth process stops, the phosphorus molecules adsorbed by the liquid nitride cryopanel 27 are allowed to move toward the liquid nitrogen cold trap 28 and be absorbed therein.

The phosphorus molecules adsorbed in the liquid nitrogen cold trap 28 are then purged by the second evacuation system 42 (i.e., the wide-range turbo-molecular pump 24 and the rotary pump 29). Since the second evacuation system 42 employs a vacuum pump capable of evacuating a gas even in a low vacuum condition, such as the wide-range turbo-molecular pump 24 as in FIG. 2, the phosphorus molecules are rapidly purged from the liquid nitride cold trap 28. Therefore, time required for the phosphorus purging step is remarkably reduced, as compared with the case in which the phosphorus molecules are purged from the liquid nitrogen cold trap 28 using a turbo-molecular pump suitable for evacuating a gas to an ultra-high vacuum condition. The reason for the above is as follows.

The purge of phosphorus molecules from an ultra-high vacuum chamber 23 is carried out in the following manner. Hot air is introduced into the liquid nitrogen cold trap 28 so as to heat the liquid nitrogen cold trap 28, thereby evaporating liquid nitrogen. As a result, the phosphorus molecules adsorbed in the liquid nitrogen cold trap 28 are purged along with the evaporated liquid nitrogen. Thereafter, the purged phosphorus molecules are evacuated from the ultra-high vacuum chamber 23 using vacuum pumps.

Although the turbo-molecular pump is suitable for obtaining an ultra-high vacuum, its operational characteristics regarding the evacuation operation are such that the evacuation capacity rapidly decreases in a low vacuum condition. Thus, it is necessary to prevent a degree of vacuum in the ultra-high vacuum chamber 23 from becoming lower than about $10^{-2}$ mbar. As a result, a temperature and a flow rate of the hot air cannot be much increased. If the temperature and the flow rate of the hot air are increased, the amount of evaporated liquid nitrogen is increased accordingly, thereby deteriorating a degree of vacuum in the ultra-high vacuum chamber 23 to $10^{-2}$ mbar or worse.

In the conventional technique, a temperature of the liquid nitrogen cold trap is maintained to be low enough so as to allow the liquid nitrogen to be gradually evaporated. Therefore, it takes much time to purge the absorbed phosphorus molecules from the liquid nitrogen cold trap. As a result, it takes a lot of time to purge the phosphorus molecules from the ultra-high vacuum chamber.

On the other hand, a wide-range turbo-molecular pump which is capable of conducting an evacuation operation even in a low vacuum condition, employed in accordance with the present invention, does not suffer the above disadvantages. Thus, hot air can be introduced into the liquid nitrogen cold trap 28 at a higher temperature and at a higher flow rate so as to allow the liquid nitrogen to be more rapidly evaporated. As a result, time required for purging the phosphorus molecules from the ultra-high vacuum chamber 23 can be remarkably reduced.

Figure 3:
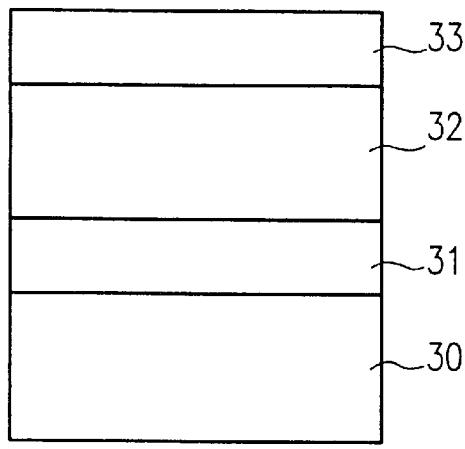
FIG. 3 is a schematic cross-sectional view of a wafer for an AlGaInP red semiconductor lasers to be fabricated using a molecular beam epitaxy apparatus.

Next, with reference to FIG. 3, a method for fabricating an AlGaInP type red semiconductor laser in a successive manner using the above-explained MBE apparatus will be described. FIG. 3 is a schematic cross-sectional view of a wafer for AlGaInP red semiconductor lasers to be fabricated using a molecular beam epitaxy apparatus.

In an actual fabrication process, an introduced GaAs substrate 30 is first placed in the growth chamber 11 and a GaAs buffer layer 31 is grown on the GaAs substrate 30 in the chamber 11. Then, the substrate 30 is transferred to the growth chamber 13, and an AlGaInP light-emitting layer 32 is grown in the chamber 13. Thereafter, the substrate 30 is transferred back to the growth chamber 11, and a GaAs cap layer 33 is grown in the chamber 11.

An oscillation threshold value of the thus fabricated semiconductor laser is not sensitive to a V/III ratio (a volume ratio of a group V material to a group III material) or a decomposition temperature of phosphorus. However, the oscillation threshold value is sensitive to a growth temperature. Therefore, it is necessary to precisely control the growth temperature.

Figure 4:
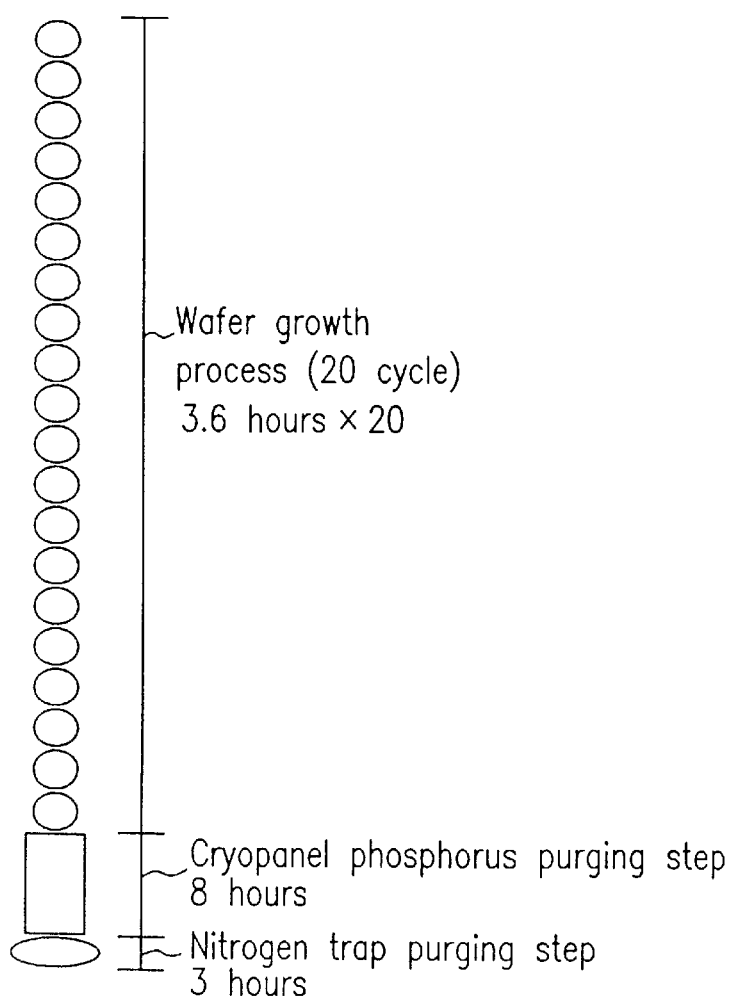
FIG. 4 is a schematic view showing a fabrication flow of semiconductor lasers using the molecular beam epitaxy apparatus shown in FIG. 1.

FIG. 4 is a schematic view showing a fabrication flow of semiconductor lasers using the molecular beam epitaxy apparatus shown in FIG. 1.

Described above is one cycle of the growth process, which requires about 3.6 hours as shown in FIG. 4. When the crystal growth is successively repeated, it is important to effectively evacuate phosphorus having a high vapor pressure in the growth chamber 13. Specifically, the gate valves 22 and 26 are opened and the gate valve 25 is closed during the growth process so that the ultra-high vacuum chamber 23 and the growth chamber 13 are evacuated using the first evacuation system 41 which is suitable for obtaining a ultra-high vacuum condition. During the growth process, the liquid nitrogen cold trap 28 in the ultra-high vacuum chamber 23 and the liquid nitrogen cryopanel 27 of the growth chamber 13 are filled with liquid nitrogen. Most of the phosphorus molecules generated during the growth process are adsorbed by the thus filled liquid nitrogen, thereby preventing the degree of vacuum of the first evacuation system 41 (the ultra-high vacuum evacuation system) from deteriorating to be at $10^{-6}$ mbar or worse.

After the above growth process is repeated for 20 cycles over about 3 days (i.e., 3.6 hours×20=72 hours=3 days), the growth process for new semiconductor lasers is ceased and the phosphorus purging step is then performed.

In the phosphorus purging step, the gate valve 26 is first opened so as to spontaneously evaporate the liquid nitrogen in the liquid nitrogen cryopanel 27 within the growth chamber 13. As a result, the phosphorus molecules absorbed in the liquid nitrogen cryopanel 27 move to the liquid nitrogen cold trap 28 within the ultra-high vacuum chamber 23. As shown in FIG. 4, this step requires about 8 hours.

The valve 22 typically remains opened during the above step. However, even when the valve 22 is closed, the same result as describe above can be obtained.

Next, the gate valves 22 and 26 are closed and the gate valve 25 is opened, so that the phosphorus molecules are purged from the liquid nitrogen cold trap 28 using the wide-range turbo-molecular pump 24. Specifically, in this step, hot air is introduced into the liquid nitrogen cold trap 28 so as to heat the liquid nitrogen cold trap 28 thereby evaporating the liquid nitrogen. As a result, the phosphorus molecules adsorbed in the liquid nitrogen cold trap 28 are purged therefrom.

A temperature rising rate for heating the liquid nitrogen cold trap 28 is determined depending on a temperature and a flow rate of the hot air. It is sufficient that a temperature of the hot air is set in the range of about 40° C. to 250° C. The lower limit of 40° C. is determined so as to prevent white phosphorus from being re-evaporated when left at room temperature. The upper limit is determined basically in accordance with the specifications of the MBE apparatus employed. The upper limit, however, is typically determined to be about 250° C.

Preferably, the temperature and the flow rate of the hot air are set to be at about 150° C. and at about 100 liters/sec, respectively.

In this embodiment, a wide-range turbo-molecular pump having an evacuation rate of about 450 liters/sec is employed as the pump 24.

Figure 8:
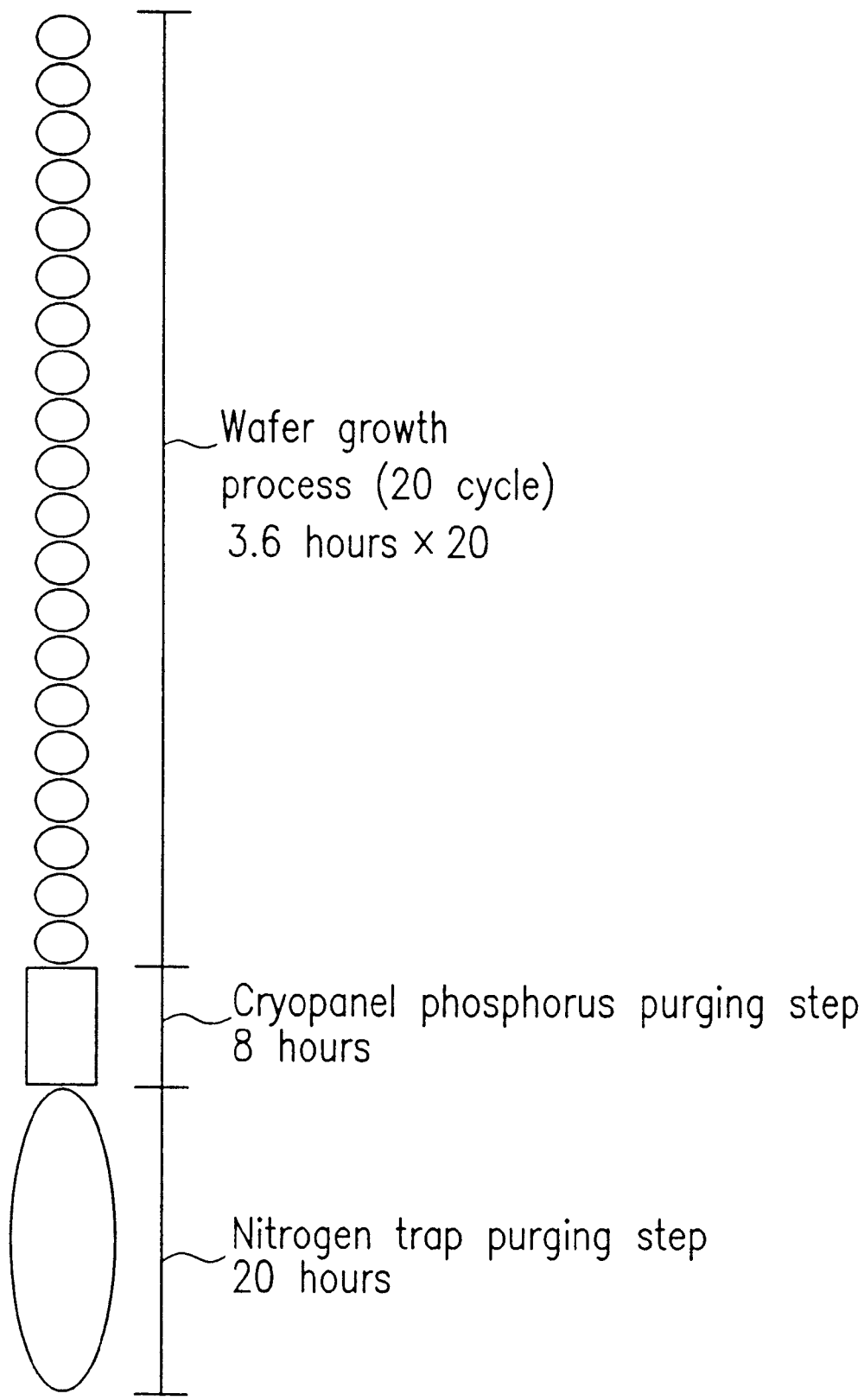
FIG. 8 is a schematic view showing a fabrication flow of semiconductor lasers using the molecular beam epitaxy apparatus shown in FIG. 7.

As shown in FIG. 4, the step for purging the liquid nitrogen cold trap 28 requires about 3 hours. This length of time, 3 hours, is remarkably shorter than 20 hours which is required to perform the corresponding purging step in the conventional technique, as previously explained with reference to FIG. 8.

As previously described, the reason for such a remarkable reduction can be explained as follows.

According to the present embodiment, the step of purging the phosphorus molecules adsorbed in the liquid nitrogen cold trap 28 is performed using the wide-range turbo-molecular pump 24 capable of conducting an evacuation operation even in a low vacuum condition. Thus, hot air can be introduced into the liquid nitrogen cold trap 28 at a higher temperature and a higher flow rate as compared with the conventional technique, so that the liquid nitrogen filling the liquid nitrogen cold trap 28 can be rapidly evaporated to purge the absorbed phosphorus molecules. Even when a degree of vacuum is lowered due to the purging step of the absorbed phosphorus, the evacuation capacity of the wide-range turbo-molecular pump 24 is not rapidly reduced. As a result, the time required for the purging step can be reduced.

As described above, according to the present embodiment, time required for the step of purging the phosphorus molecules from the liquid nitrogen cold trap 28 can be reduced to about 3 hours from about 20 hours in the conventional technique. As a result, the operation time of the MBE apparatus required to perform the 20 cycles of the growth process can be reduced from about 100 hours to about 83 hours. Therefore, a productivity can be improved by about 20%.

Although the turbo-molecular pump 20 is used as an ultra-high vacuum evacuation pump in the first evacuation system 41 in the above-described embodiment, the similar advantages can be obtained even when an oil diffusion pump is used instead of the turbo-molecular pump 20. Alternatively, an ion pump or a cryopump can be used instead. In such a case, however, careful maintenance is needed to purge phosphorus molecules accumulated within the pump.

Figure 5:
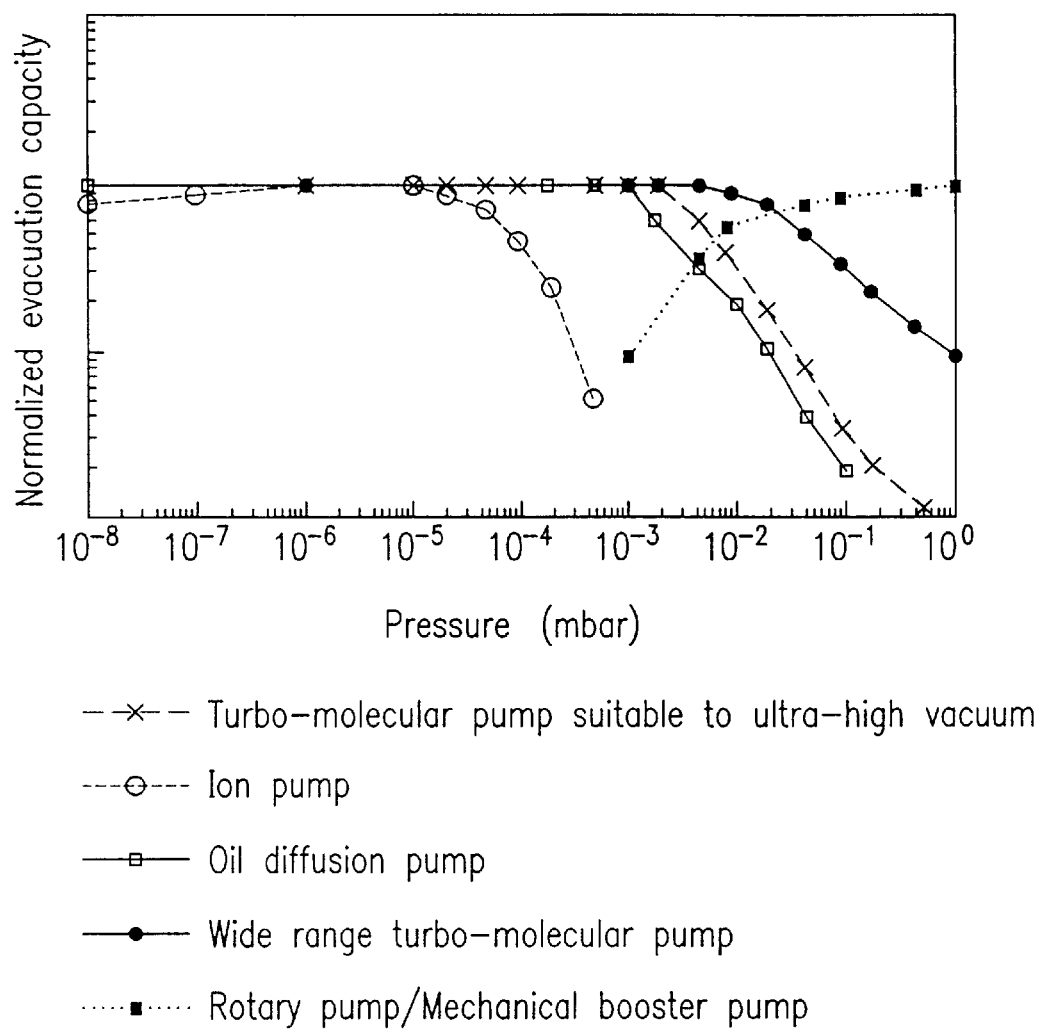
FIG. 5 is a graph showing pressure dependencies of representative evacuation capacity of various pumps applicable to the present invention.

FIG. 5 is a graph showing the pressure dependencies of typical evacuation capacities of various pumps applicable to the present invention. The evacuation capacities are normalized by using the maximum value for the respective pumps as the reference. The maximum evacuation capacity of the individual pump may be different from that for another pump based on the respective specifications, even when those pumps are classified in the same category.

In the above, the wide-range turbo-molecular pump 24 is employed for conducting an evacuation operation in a low vacuum condition. Alternatively, a rotary pump may instead be used since a degree of vacuum in the ultra-high vacuum chamber 23 decreases during the phosphorus purging step.

In the above embodiment, the fabrication of a red semiconductor laser using solid phosphorus is explained as an example. It should be appreciated that the present invention is also applicable to the case where other materials having a high vapor pressure, such as selenium or sulfur, are used. Similarly, the present invention is also applicable to the case where a gas material such as phosphine ($PH_3$) is used, resulting in an improved productivity even in such a case.

Figure 6:
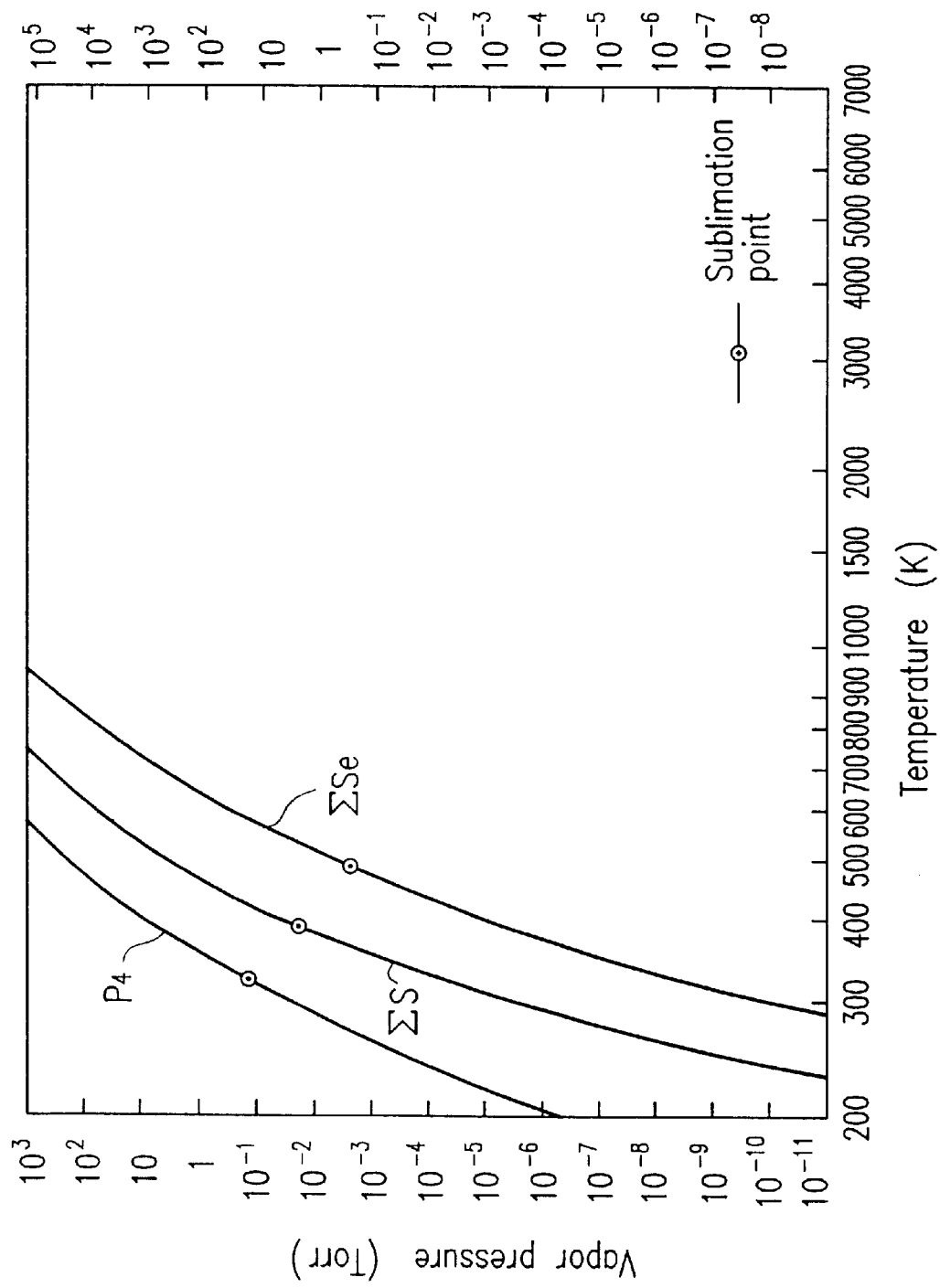
FIG. 6 is a graph showing the relationship between a temperature (Kelvin) and a vapor pressure (torr) of some materials applicable to the present invention.
Figure 7:
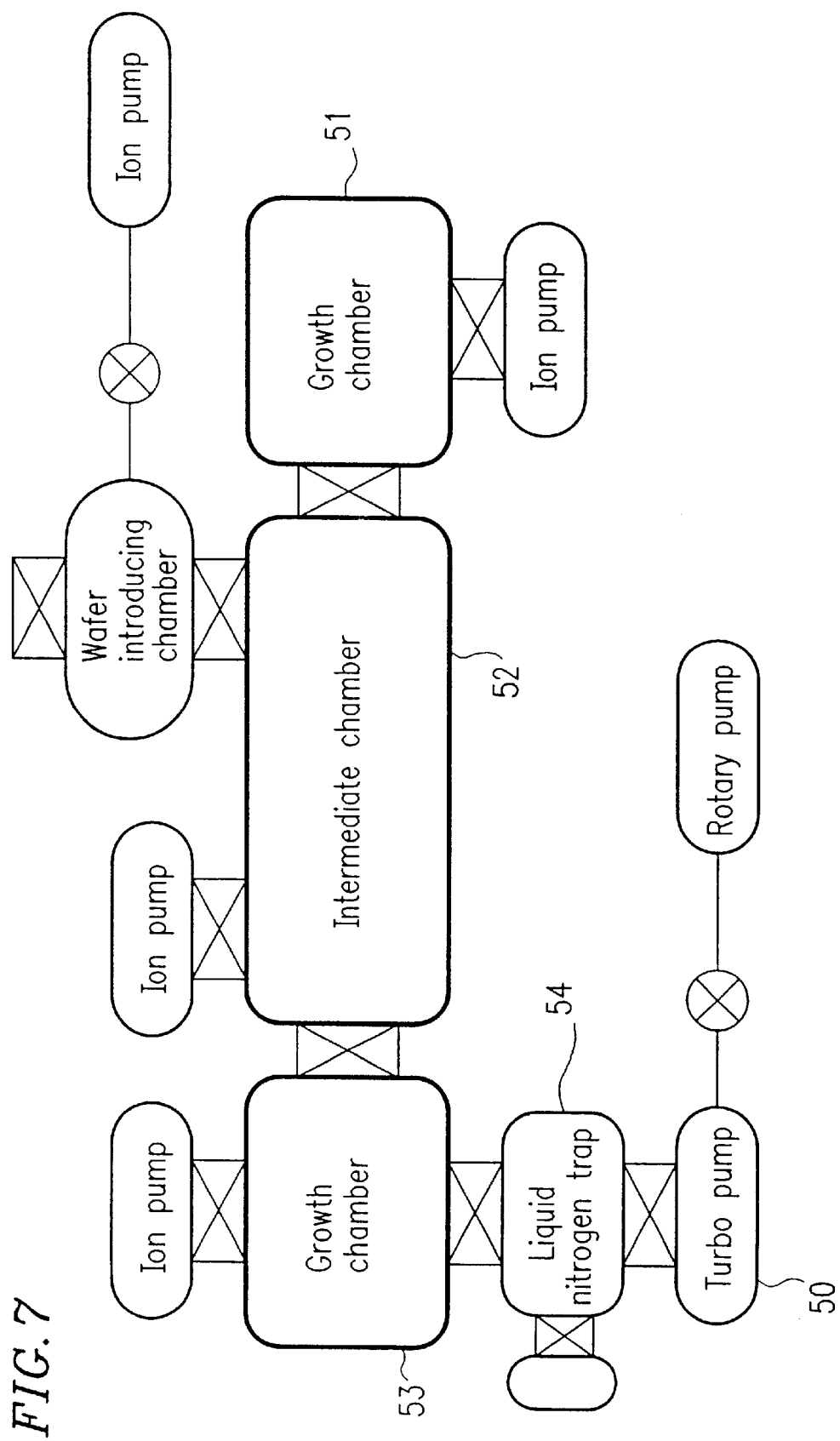
FIG. 7 is a schematic plan view showing an exemplary conventional molecular beam epitaxy apparatus.

FIG. 6 is a graph showing the relationship between a temperature (K) and a vapor pressure (torr) of materials which can be used in the present invention. Specifically, the data for phosphorus (P), sulfur (S), and selenium (Se) are illustrated in FIG. 6.

In FIG. 6, phosphorus is represented by a line indicated with $P_4$. In a growth process using the MBE technique, phosphine is thermally decomposed and then supplied, and therefore does not affect the phosphorus purging step. Even when phosphine is used as a material for the growth process, $P_4$ is adsorbed by the growth chamber.

The present invention is applicable to the fabrication of other devices than the red semiconductor lasers. It should be appreciated that the present invention is applicable to the fabrication of such devices as semiconductor lasers, high-speed electron devices or the like, with material systems such as an AlGaInAsP type material system, a MgCdZnSSe type material system, or the like.

According to the method and the apparatus for fabricating semiconductor of the present invention, the step of purging the absorbed phosphorus molecules in the liquid nitrogen cold trap within the ultra-high vacuum chamber is performed using an evacuation system (pump) capable of conducting an evacuation operation even in a low vacuum condition. Consequently, the time required for purging the absorbed phosphorus can be remarkably reduced. As a result, the operation time required for a molecular beam epitaxy apparatus to perform the growth process for a certain number of cycles is considerably reduced, as compared with the conventional technique. Thus, a production efficiency of the semiconductor wafer can be remarkably improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor fabrication apparatus for evaporating a material in a growth chamber by a molecular beam epitaxy technique to fabricate a semiconductor, comprising:

an ultra-high vacuum chamber including a liquid nitrogen cold trap therein, the ultra-high vacuum chamber being connected to the growth chamber via a valve;

a first evacuation system including an ultra-high vacuum evacuation system, the first evacuation system being connected to the ultra-high vacuum chamber; and a second evacuation system including an evacuation system capable of conducting an evacuation operation even in a low vacuum condition, the second evacuation system being connected to the liquid nitrogen cold trap, wherein the first evacuation system and the second evacuation system independently conduct the respective evacuation operations.

2. A semiconductor fabrication apparatus according to claim 1, wherein the first evacuation system includes a turbo-molecular pump.

3. A semiconductor fabrication apparatus according to claim 1, wherein the first evacuation system includes an oil diffusion pump.

4. A semiconductor fabrication apparatus according to claim 1, wherein the second evacuation system includes a wide-range turbo-molecular pump.

5. A semiconductor fabrication apparatus according to claim 1, wherein the second evacuation system includes a rotary pump.

6. A semiconductor fabrication method for evaporating a material in a growth chamber by a molecular beam epitaxy technique to fabricate a semiconductor, using a semiconductor fabrication apparatus including:

an ultra-high vacuum chamber including a liquid nitrogen cold trap therein, the ultra-high vacuum chamber being connected to the growth chamber via a valve;

a first evacuation system including an ultra-high vacuum evacuation system, the first evacuation system being connected to the ultra-high vacuum chamber; and a second evacuation system including an evacuation system capable of conducting an evacuation operation even in a low vacuum condition, the second evacuation system being connected to the liquid nitrogen cold trap, the method comprising the steps of:

stopping the evacuation operation of the second evacuation system, and evacuating the ultra-high vacuum chamber and the growth chamber using the first evacuation system, while conducting a growth process with respect to a wafer in the growth chamber; and stopping the evacuation operation of the first evacuation system, and purging molecules absorbed onto the liquid nitrogen cold trap using the second evacuation system.

7. A semiconductor fabrication method according to claim 6, wherein the step of purging the molecules absorbed onto the liquid nitrogen cold trap includes the step of introducing hot air into the liquid nitrogen cold trap so as to evaporate liquid nitrogen, thereby purging the absorbed molecules.

8. A semiconductor fabrication method according to claim 7, wherein the hot air has a temperature in a range from about 40° C. to about 250° C.

9. A semiconductor fabrication method according to claim 8, wherein the hot air has a temperature of about 150° C.

10. A semiconductor fabrication method according to claim 6, wherein the material has a high vapor pressure.

11. A semiconductor fabrication method according to claim 10, wherein the material is phosphorus.

* * * * *